(12) United States Patent
Nam et al.

(10) Patent No.: US 11,293,994 B2
(45) Date of Patent: Apr. 5, 2022

(54) EARTH LEAKAGE CIRCUIT BREAKER CAPABLE OF OUTPUTTING TYPE OF LEAKAGE CURRENT AND METHOD OF CONTROLLING THE SAME

(71) Applicant: LSIS CO., LTD., Anyang-si (KR)

(72) Inventors: Sunggyu Nam, Anyang-si (KR); Jongung Lim, Anyang-si (KR)

(73) Assignee: LSIS CO., LTD., Anyang-si (KR)

( * ) Notice: Subject to any disclaimer, the term of this patent is extended or adjusted under 35 U.S.C. 154(b) by 161 days.

(21) Appl. No.: 16/574,811

(22) Filed: Sep. 18, 2019

(65) Prior Publication Data
US 2020/0217883 A1 Jul. 9, 2020

(30) Foreign Application Priority Data
Jan. 7, 2019 (KR) ............ 10-2019-0001834

(51) Int. Cl.
*G01R 31/50* (2020.01)
*H02H 1/00* (2006.01)
*H02H 3/16* (2006.01)

(52) U.S. Cl.
CPC ........... *G01R 31/50* (2020.01); *H02H 1/0007* (2013.01); *H02H 3/16* (2013.01)

(58) Field of Classification Search
CPC ... G01R 1/00; H02H 1/00; H01H 1/00; H01H 69/00
See application file for complete search history.

(56) References Cited

U.S. PATENT DOCUMENTS

| | | | | |
|---|---|---|---|---|
| 2012/0185185 A1* | 7/2012 | Bae | ............ | H04Q 9/00 702/58 |
| 2013/0089344 A1* | 4/2013 | Choi | ............ | G03G 15/55 399/33 |
| 2015/0311862 A1* | 10/2015 | Lee | ............ | G01R 31/52 702/58 |
| 2015/0331025 A1* | 11/2015 | Arashima | ............ | G01R 22/063 702/62 |
| 2017/0316896 A1* | 11/2017 | Seon | ............ | H01H 83/02 |
| 2017/0317483 A1* | 11/2017 | Seon | ............ | H02H 3/08 |

FOREIGN PATENT DOCUMENTS

| | | |
|---|---|---|
| CN | 102067263 A | 5/2011 |
| CN | 202059151 U | 11/2011 |
| CN | 103384951 A | 11/2013 |
| CN | 107342578 A | 11/2017 |
| KR | 200193053 | 6/2000 |
| KR | 100357206 | 10/2002 |

OTHER PUBLICATIONS

Chinese Office Action for related Chinese Application No. 201910815747.5; action dated Nov. 1, 2021; (9 pages).

* cited by examiner

*Primary Examiner* — Jermele M Hollington
*Assistant Examiner* — Temilade S Rhodes-Vivour
(74) *Attorney, Agent, or Firm* — K&L Gates LLP

(57) ABSTRACT

An earth leakage circuit breaker and a method of controlling the same are disclosed. An earth leakage circuit breaker according to the present disclosure can detect a type of leakage current and output the type of the leakage current in various forms such that a user can recognize the type of the leakage current. Therefore, the user can easily recognize whether or not the leakage current has occurred and the type of the leakage current. This may facilitate the user to recognize the cause of the leakage and take an effective measure for preventing an accident.

7 Claims, 11 Drawing Sheets

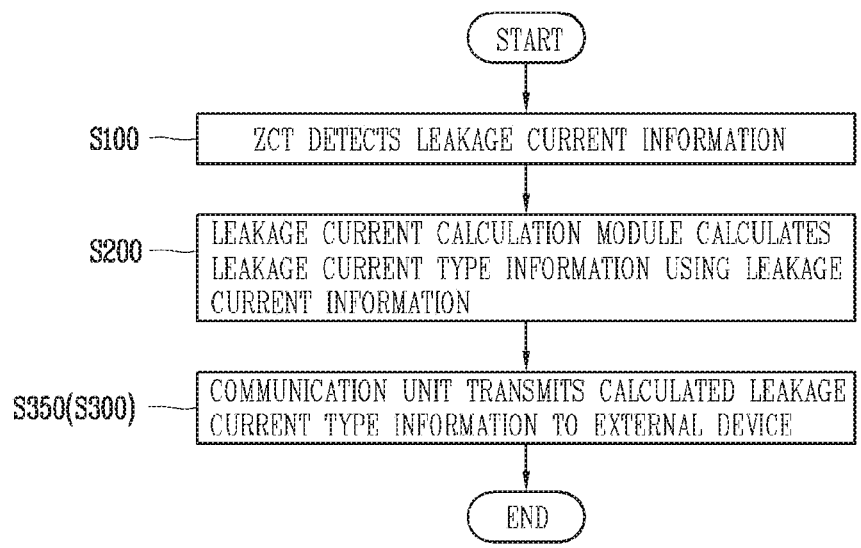

EARTH LEAKAGE CIRCUIT BREAKER CAPABLE OF OUTPUTTING TYPE OF LEAKAGE CURRENT AND METHOD OF CONTROLLING THE SAME

CROSS-REFERENCE TO RELATED APPLICATION

Pursuant to 35 U.S.C. § 119(a), this application claims the benefit of an earlier filing date of and the right of priority to Korean Patent Application No. 10-2019-0001834, filed on Jan. 7, 2019, the contents of which are incorporated by reference herein in its entirety.

BACKGROUND OF THE DISCLOSURE

1. Field of the Disclosure

The present disclosure relates to an earth leakage circuit breaker and a method of controlling the same, and more particularly, to an earth leakage circuit breaker, capable of outputting a type of a detected leakage current so that a user can identify the type of the leakage current, and a method of controlling the same.

2. Background Art

A circuit breaker is a device used to prevent an excessive current flow by converting a current into arc when a current above a rated current flows. The circuit breaker also serves to cut off a current to prevent an occurrence of a safety accident when a leakage current is generated.

The arc converted from the current is extinguished in an arc chamber and discharged to outside. Accordingly, accidents due to leakage current and excessive current can be prevented.

The related art circuit breaker typically includes a movable contactor and a fixed contactor that are separated from each other to generate an arc when an overcurrent flows. The arc generated as the movable contactor is separated from the fixed contactor is extinguished through the arc chamber and discharged to outside. This is called a trip process.

Korean Utility Model Registration No. 20-0193053 discloses an earth leakage circuit breaker capable of informing whether either a short circuit or an earth leakage occurs in a distinguishing manner. In detail, an earth leakage circuit breaker is disclosed having a structure that is provided with an earth leakage display unit for displaying an AC earth leakage signal, and a short-circuit display unit for displaying a short-circuit signal, so that the user can identify whether either an earth leakage or a short-circuit occurs.

By the way, this type of earth leakage circuit breaker has a limitation in that the user can recognize separately whether the earth leakage or the short-circuit occurs but cannot recognize a type of current which is leaked.

Korean Patent Registration No. 10-0357026 discloses an earth leakage display device capable of displaying an occurrence of an earth leakage to outside when the earth leakage occurs on a line. Specifically, such document discloses an earth leakage display device having a structure in which a display surface is formed on an indicate lever movable together with a mover and an earth leakage display plate is attached to the display surface to be exposed to a display window, so that the earth leakage display plate appears on the display window when the mover moves.

However, this type of earth leakage circuit breaker still has a limitation in that the user cannot recognize a type of current leaked although the user is immediately aware of an occurrence of an earth leakage at the time when a current is leaked.

PRIOR ART DOCUMENTS

Patent Documents

Korean Utility Model Registration No. 20-0193053 (Sep. 1, 2000) Korea Patent Registration No. 10-0357206 (Oct. 19, 2002)

SUMMARY OF THE DISCLOSURE

An aspect of the present disclosure is to provide an earth leakage circuit breaker having a structure capable of solving those aforementioned problems, and a method of controlling the same.

One aspect of the present disclosure is to provide an earth leakage circuit breaker having a structure in which a user can immediately recognize whether or not a leakage current is generated and a type of the leakage current, and a method of controlling the same.

Another aspect of the present disclosure is to provide an earth leakage circuit breaker having a structure in which a user can easily recognize in a visual manner whether or not a leakage current is generated and a type of the leakage current, and a method of controlling the same.

Still another aspect of the present disclosure is to provide an earth leakage circuit breaker having a structure in which a user can easily recognize in an audible manner whether or not a leakage current is generated and a type of the leakage current, and a method of controlling the same.

Still another aspect of the present disclosure is to provide an earth leakage circuit breaker having a structure in which a user can easily recognize through an external device whether or not a leakage current is generated and a type of the leakage current, even when the user is not located near the earth leakage circuit breaker, and a method of controlling the same.

In order to achieve the above aspects and other advantages according to an embodiment of the present disclosure, there is provided an earth leakage circuit breaker, including a zero current transformer (ZCT) configured to detect leakage current information, a leakage current calculation module electrically connected to the zero current transformer, and configured to calculate leakage current type information using the leakage current information detected by the zero current transformer, and an output module electrically connected to the leakage current calculation module, and configured to output the leakage current type information calculated by the leakage current calculation module.

The output module may include a visual information calculating unit configured to calculate the calculated leakage current type information in a form of visual information.

The output module may include a visual information output unit configured to output the calculated visual information.

The output module may include an auditory information calculating unit configured to calculate the leakage current type information in a form of auditory information.

The output module may include an auditory information output unit configured to output the calculated auditory information.

The output module may include a communication unit configured to transmit the calculated leakage current type information to outside.

Also, the present invention provide a method for controlling an earth leakage circuit breaker, and the method may include (a) detecting, by a zero current transformer, leakage current information, (b) calculating, by a leakage current calculation module, leakage current type information using the leakage current information, and (c) outputting, by an output module, the calculated leakage current type information.

The method may further include (c1) calculating, by a visual information calculating unit, the calculated leakage current type information in a form of visual information, and (c2) outputting, by a visual information output unit, the calculated visual information.

The method may further include (d1) calculating, by an auditory information calculating unit, the calculated leakage current type information in a form of auditory information, and (d2) outputting, by an auditory information output unit, the calculated auditory information.

The method may further include (e) transmitting, by a communication unit, the leakage current type information to an external device.

According to the present disclosure, the following effects can be achieved.

First, a leakage current calculation module provided in an earth leakage circuit breaker includes a type information calculating unit for calculating a type of leakage current. As a result, the calculated type information can be output through an output module, together with information related to whether an earth leakage has occurred.

Therefore, the user can immediately recognize whether or not a leakage current has been generated and a type of the leakage current.

The output module also includes a visual information calculating unit and a visual information output unit. As a result, the information related to whether or not the leakage current has been generated and the type of the leakage current may be calculated in the form of visual information for output.

This can facilitate the user to visually recognize the generation or non-generation of the leakage current and the type of the leakage current.

The output module also includes an auditory information calculating unit and an auditory information output unit. As a result, the information related to whether or not the leakage current has been generated and the type of the leakage current can be calculated in the form of auditory information for output.

This can facilitate the user to auditorily recognize the generation or non-generation of the leakage current and the type of the leakage current even without observing the earth leakage circuit breaker.

Furthermore, the output module includes a communication unit for transmitting and receiving information to and from an external device. As a result, the information related to whether or not the leakage current has been generated and the type of the leakage current can be transmitted to an external device connected in a wired or wireless manner.

This can facilitate the user to recognize the generation or non-generation of the leakage current and the type of the leakage current even when the earth leakage circuit breaker is not located near the user.

BRIEF DESCRIPTION OF THE DRAWINGS

FIG. 13 is a flowchart illustrating a method of controlling an earth leakage circuit breaker according to FIG. 10.

DETAILED DESCRIPTION OF THE DISCLOSURE

1. Description of the Related Art

Figure 1:
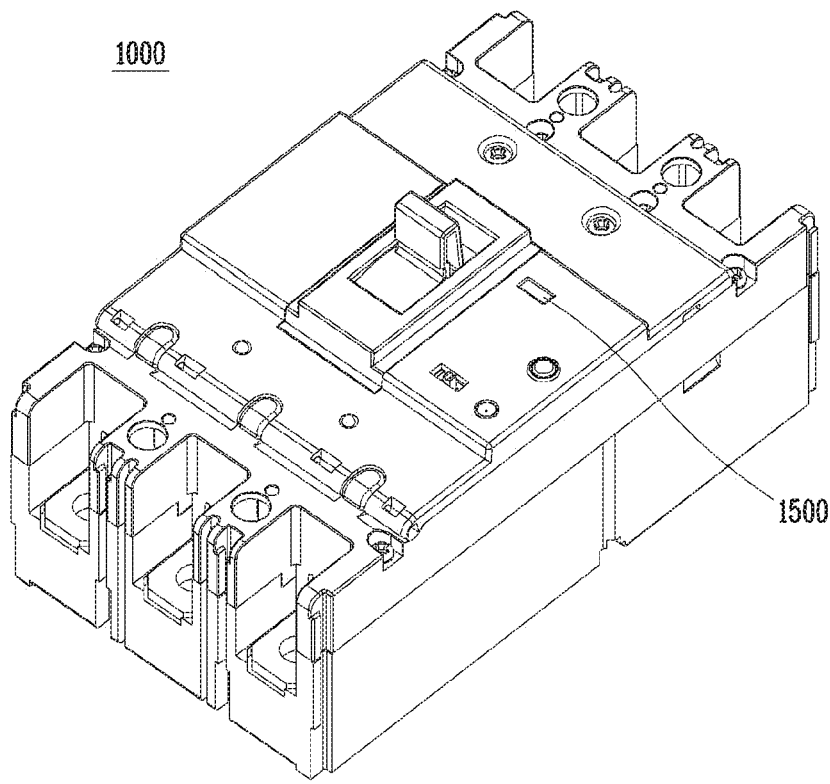
FIG. 1 is a perspective view of an earth leakage circuit breaker according to the related art.

Referring to FIG. 1, an earth leakage circuit breaker 1000 according to the related art includes a display unit 1500 at an outside thereof. The display unit 1500 displays whether the earth leakage circuit breaker 1000 operates or whether a trip operation is performed in different colors, so that a user can visually recognize the current state of the earth leakage circuit breaker 1000.

Figure 2:
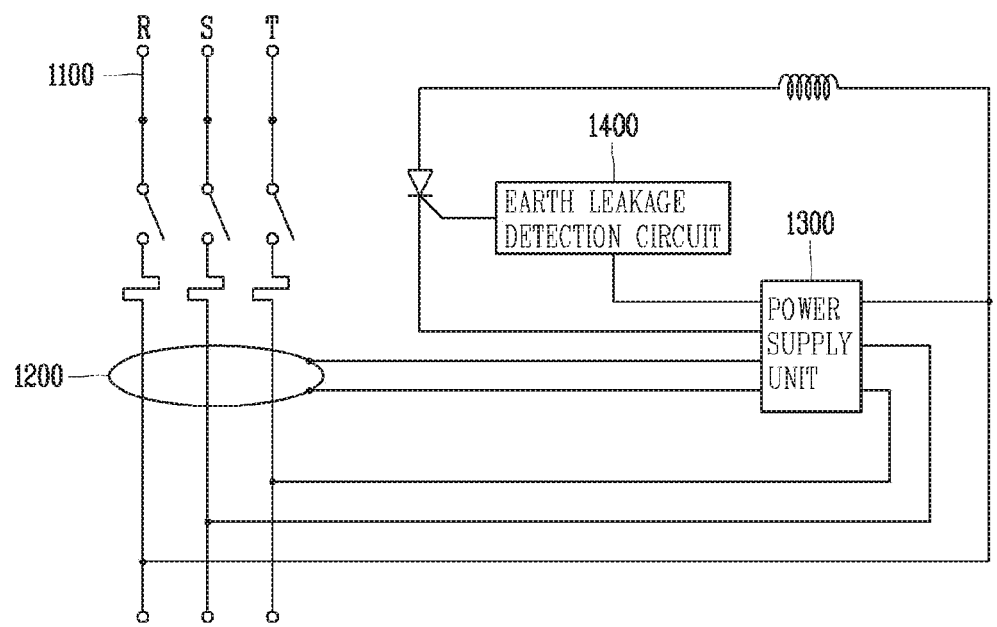
FIG. 2 is a circuit diagram of a circuit provided inside the earth leakage circuit breaker of FIG. 1 for detecting a leakage current.

Hereinafter, an operation process of the earth leakage circuit breaker 1000 according to the related art will be described with reference to FIG. 2.

First, current and power are supplied from a three-phase load 1100. In addition, a zero current transformation (ZCT) 1200 detects whether the current supplied from the three-phase load 1100 is leaked.

A power supply module 1300 receives power from the three-phase load 1100. When the leakage of the current is detected in the zero current transformer 1200, the power supply module 1300 transmits a corresponding signal to an earth leakage detection circuit 1400.

The earth leakage detection circuit 1400 receives the signal related to the leakage of the current from the power supply module 1300 and transmits a trip signal for mechanical trip according to a preset operating current.

A trip device (not shown) is operated according to the trip signal transmitted from the earth leakage detection circuit 1400 so as to perform a trip operation for preventing a leakage current.

At this time, the trip signal transmitted from the earth leakage detection circuit 1400 is also transmitted to the display unit 1500 described above. The display unit 1500 may notify the user that the leakage current has been generated, in a manner of changing a color in correspondence with the received trip signal.

Recently, as the environment in which an earth leakage circuit breaker is provided becomes different due to industrial improvement and diversification, types and waveforms of currents leaked are diversifying.

Figure 3:
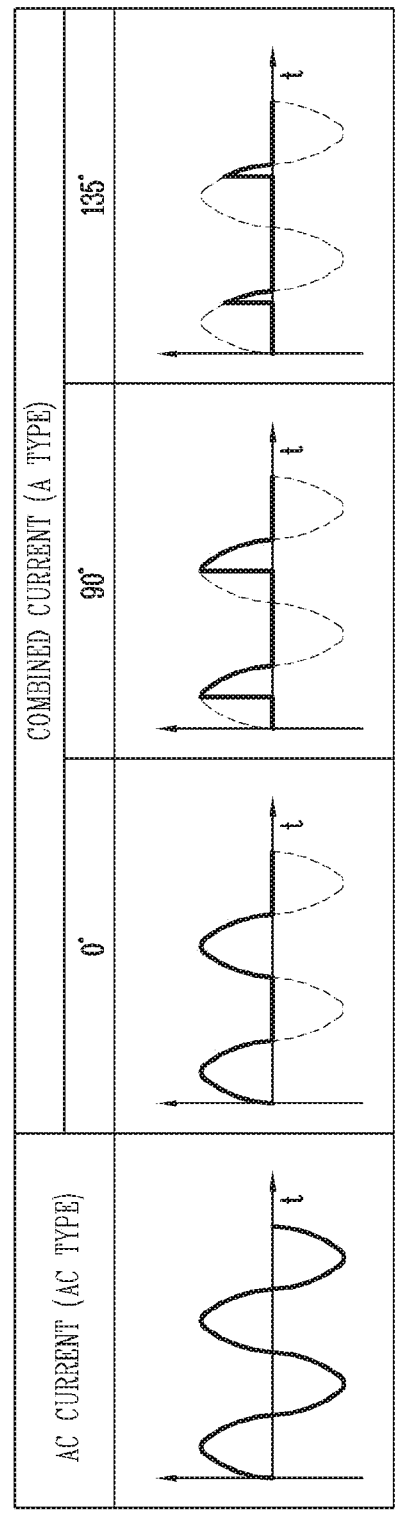
FIG. 3 is a graph showing types of leakage currents.

Referring to FIG. 3, waveforms of currents may be classified into an alternating current (AC current), a direct current (DC current), and a combined current (type A) of the AC current and the DC current.

In addition, the waveform of each current shown in FIG. 3 is ideal. Considering the environment in which the earth leakage circuit breaker is provided, actual waveforms of currents are further complicated due to being combined with noise and the like.

In other words, recognizing (identifying) type and waveform of a generated leakage current is important in terms of analyzing the cause of a malfunction of an electrical system where the leakage current is generated and establishing a follow-up countermeasure.

However, the earth leakage circuit breaker 1000 according to the related art described above can indicate only whether the leakage current is generated. That is, the earth leakage circuit breaker 1000 according to the related art has a limitation in that it cannot display the type of the generated leakage current.

2. Explanation of Terms

Hereinafter, an earth leakage circuit breaker and a method of controlling the same according to exemplary embodiments of the present disclosure, capable of solving the aforementioned problems, will be described in detail with reference to the accompanying drawings.

In the following description, descriptions of some components may be omitted to help understanding of the present disclosure.

As used in the following description, the term "breaker" refers to an arbitrary device, such as an earth leakage circuit breaker or a molded case circuit breaker, capable of cutting off a current when a leakage current or an overcurrent is detected.

As used in the following description, the term "module" refers to an arbitrary device capable of transmitting, receiving or storing current, power, electric signals, electric information, and the like.

As used in the following description, the term "alternating current (AC current)" refers to a current whose waveform changes in magnitude and direction periodically according to a lapse of time, like a sine wave or a cosine wave.

As used in the following description, the term "direct current (DC current)" refers to a constant current without changing in magnitude and direction over time.

As used in the following description, the term "combined current" refers to a current obtained by combining at least one of the AC current or DC current. That is, the combined current is formed by combining a plurality of AC currents, combining a plurality of DC currents, or combining the AC current and the DC current.

As used in the following description, the term "leakage current information" refers to information related to whether a leakage current has been generated.

As used in the following description, the term "leakage current type information" refers to information related to the type of the leakage current according to the waveform of the leakage current. As shown in FIG. 3, the leakage current type information may include "AC current information", "DC current information", and "combined current information" in which at least one of the AC current information and the DC current information is combined.

As used in the following description, the term "power information" refers to information related to whether power is applied to the earth leakage circuit breaker 10.

Figure 4:
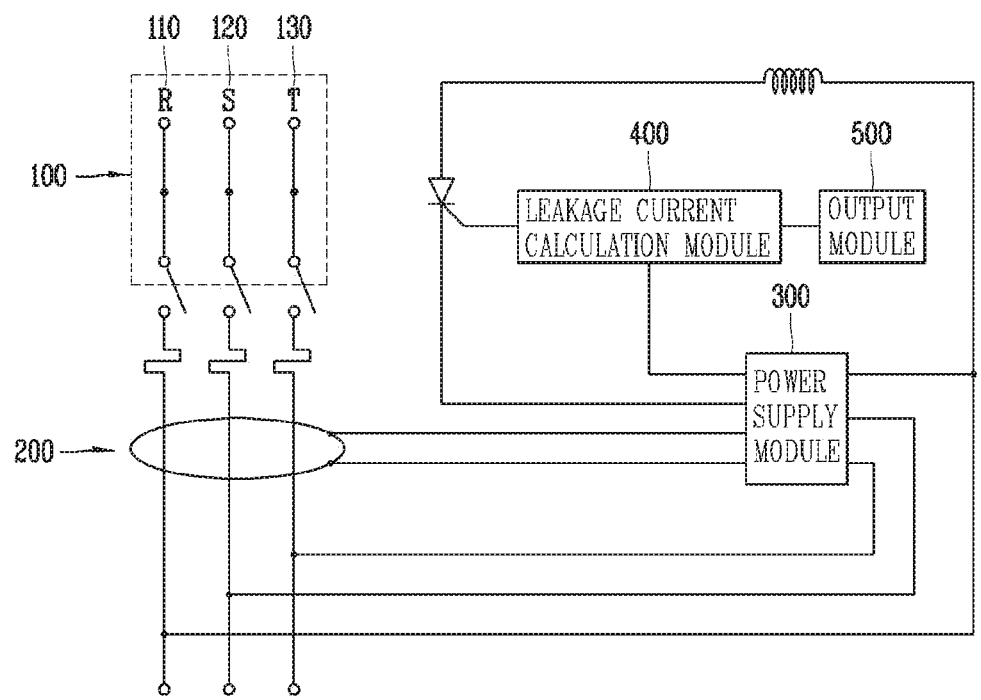
FIG. 4 is a circuit diagram of a circuit provided in an earth leakage circuit breaker for detecting a leakage current, in accordance with an embodiment of the present disclosure.
Figure 5:
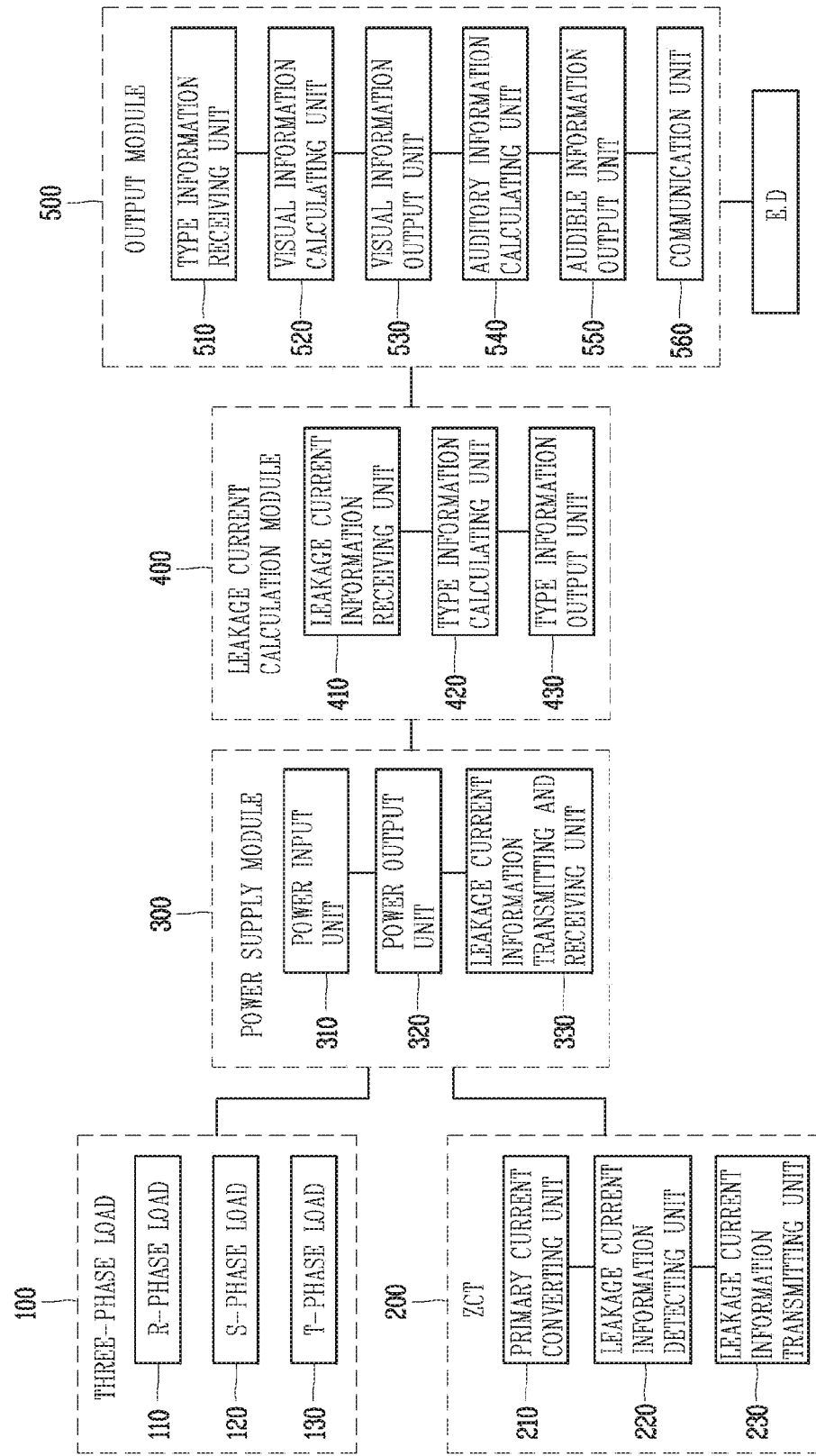
FIG. 5 is a block diagram illustrating each component of the circuit diagram of FIG. 4.

2. Description of Configuration of Earth Leakage Circuit Breaker 10 According to Embodiment of the Disclosure Referring to FIGS. 4 and 5, an earth leakage circuit breaker 10 according to an exemplary embodiment of the present disclosure may include a three-phase load 100, a zero current transformer (ZCT) 200, a power supply module 300, a leakage current calculation module 400, and an output module 500.

The components are electrically connected. To this end, elements (not shown), such as separate wires, may be provided to electrically connect those components.

(1) Description of Three-Phase Load 100

The three-phase load 100 receives current and power supplied from outside of the earth leakage circuit breaker 10.

The current supplied to the three-phase load 100 is introduced into the earth leakage circuit breaker 10 from an external conductor (not shown) provided with the earth leakage circuit breaker 10. That is, the current supplied to the three-phase load 100 is a current to be detected as to whether it has been leaked.

The power supplied to the three-phase load 100 is used to drive components of the earth leakage circuit breaker 10 to be described later. Specifically, the power supplied to the three-phase load 100 is transferred to the zero current transformer (ZCT) 200, the power supply module 300, the leakage current detection module 400, and the output module 500 to be described later. To this end, those components may be electrically connected as described above.

In the illustrated embodiment, the three-phase load 100 includes an R-phase load 110, an S-phase load 120, and a T-phase load 130. That is, the three-phase load 100 receives currents and power from outside through three conductor parts.

In an embodiment not shown, the three-phase load 100 may include only a single-phase load. In this case, the three-phase load 100 may be called a single-phase load.

(2) Description of Zero Current Transformer (ZCT) 200

The zero current transformer (ZCT) 200 detects whether a current passed through the three-phase load 100 has been leaked, that is, leakage current information. In addition, power for operating the ZCT 200 is transmitted from the three-phase load 100.

The ZCT 200 is electrically connected to the three-phase load 100, the power supply module 300, and the leakage current calculation module 400.

The ZCT 200 includes a primary current converting unit 210, a leakage current information detecting unit 220, and a leakage current information transmitting unit 230.

The primary current converting unit 210 converts the current transmitted through the three-phase load 100 into a primary current.

Specifically, as aforementioned, the three-phase load 100 includes an R-phase load 110, an S-phase load 120, and a T-phase load 130. Accordingly, the currents transmitted from the three-phase load 100 to the ZCT 200 are three-phase currents having a phase difference of 120°, respectively.

The primary current converting unit 210 converts the received three-phase currents into a primary current. When the converted primary current includes a zero current, a magnetic flux corresponding to the zero current is generated.

The leakage current information detecting unit 220 detects leakage current information by using the zero current included in the primary current converted through the aforementioned process. The leakage current information detected by the leakage current information detecting unit 220 is transferred to the leakage current information transmitting unit 230.

Since the process of detecting the leakage current information in the aforementioned manner is a well-known technology, a detailed description thereof will be omitted.

The leakage current information transmitting unit 230 transfers the leakage current information detected by the leakage current information detecting unit 220 to the power supply module 300. To this end, the leakage current information transmitting unit 230 and the power supply module 300 may be electrically connected to each other.

(3) Description of Power Supply Module 300

The power supply module 300 receives the power delivered to the three-phase load 100 and transfers the power to each component of the earth leakage circuit breaker 10 for operating the earth leakage circuit breaker 10.

To this end, the three-phase load 100 and the power supply module 300 may be electrically connected by an electric connection element (not shown).

In addition, the power supply module 300 transmits the leakage current information detected by the ZCT 200 to the leakage current calculation module 400 which will be described later.

To this end, the power supply module 300 may be electrically connected to the ZCT 200 and the leakage current calculation module 400 by electric connection elements (not shown).

The power supply module 300 includes a power input unit 310, a power output unit 320, and a leakage current information transmitting and receiving unit 330.

The power input through the three-phase load 100 is input into the power input unit 310. Power input into the power input unit 310 is transmitted to the power output unit 320.

The power output unit 320 receives the power input through the power input unit 310. The power delivered to the power output unit 320 is transmitted to the ZCT 200, the leakage current calculation module 400, and the output module 500, and used to operate the respective modules 200, 400, and 500.

To this end, the power output unit 320 may be electrically connected to the ZCT 200, the leakage current calculation module 400, and the output module 500.

The leakage current information transmitting and receiving unit 330 receives the leakage current information detected by the ZCT 200. In addition, the leakage current information transmitting and receiving unit 330 transmits the received leakage current information to the leakage current calculation module 400 to be described later. The leakage current information transmitting and receiving unit 330 may be electrically connected to the ZCT 200 and the leakage current calculation module 400.

In addition, in an embodiment not shown, the power supply module 300 may include a power information calculating unit (not shown) and a power information transmitting unit (not shown).

The power information calculating unit (not shown) calculates power information related to whether power has been applied to the earth leakage circuit breaker 10. The calculated power information may be transmitted to the output module 500 to be described later through the power information transmitting unit (not shown).

The output module 500 may be configured to output the received power information in various forms so that a user can recognize whether the earth leakage circuit breaker 10 is operated.

(4) Description of Leakage Current Calculation Module 400

The leakage current calculation module 400 calculates (computes) leakage current type information using the leakage current information received from the power supply module 300. In addition, the leakage current calculation module 400 may transmit the calculated leakage current type information to the output module 500 to be described later so that the user can recognize the leakage current type information.

The leakage current calculation module 400 may be provided as an arbitrary device capable of inputting/outputting and calculating information in order to calculate type information related to a leakage current. In one embodiment, the leakage current calculation module 400 may be configured as a micro control unit (MCU), a microprocessor, a central processing unit (CPU), or the like.

The leakage current calculation module 400 is electrically connected to the power supply module 300 and the output module 500 to be described later. The leakage current calculation module 400 may receive the leakage current information from the power supply module 300, calculate the type information related to the leakage current, and transmit the leakage current type information to the output module 500.

The leakage current calculation module 400 includes a leakage current information receiving unit 410, a type information calculating unit 420, and a type information output unit 430.

The leakage current information receiving unit 410 receives the leakage current information from the power supply module 300. The leakage current information received by the leakage current information receiving unit 410 is transferred to the type information calculating unit 420.

The type information calculating unit 420 calculates type information related to the leakage current by using the received leakage current information.

As described above, the leakage current type information may be classified into any one of AC current information, DC current information, and combined current information.

The type information calculating unit 420 calculates the leakage current type information into any one of the AC current information, the DC current information, and the combined current information by using the received leakage current information.

The leakage current type information calculated by the type information calculating unit 420 is transferred to the type information output unit 430.

The type information output unit 430 transmits the leakage current type information received from the type information calculating unit 420 to the output module 500 to be described later.

The type information output unit 430 may be electrically connected to the output module 500.

(5) Description of Output Module 500

The output module 500 receives the leakage current type information calculated by the leakage current calculation module 400 and calculates the information into various forms. The leakage current type information calculated in the various forms is output for the user to be recognizable.

The output module 500 may be provided in various shapes. As will be described later, the output module 500 may be provided as an LCD, an LED, a lamp, etc. to output visual information. In addition, the output module 500 may be provided as a speaker to output auditory information.

In addition, the output module 500 may be provided as a wired/wireless Internet, Radio-Frequency Identification (RFID), a communication port, Bluetooth, etc. so as to transmit the leakage current type information to an external device E.D.

The output module 500 is electrically connected to the power supply module 300 and the leakage current calculation module 400.

The output module 500 includes a type information receiving unit 510, a visual information calculating unit 520, a visual information output unit 530, an auditory information calculating unit 540, an auditory information output unit 550, and a communication unit 560.

The type information receiving unit 510 receives the leakage current type information calculated by the leakage current calculation module 400. The leakage current type information received by the type information receiving unit 510 is transmitted to the visual information calculating unit 520, the auditory information calculating unit 540, and the communication unit 560, respectively.

The type information receiving unit 510, the visual information calculating unit 520, the auditory information calculating unit 540, and the communication unit 560 may be electrically connected.

The visual information calculating unit 520 calculates the received leakage current type information into various forms of visual information.

Type of visual information calculated by the visual information calculating unit 520 may be configured in various ways according to the form of the visual information output unit 530. A detailed description thereof will be described later.

The visual information calculated by the visual information calculating unit 520 is transferred to the visual information output unit 530. As described above, the visual information calculating unit 520 and the visual information output unit 530 are electrically connected to each other.

The visual information output unit 530 outputs the visual information calculated by the visual information calculating unit 520 so that the user can visually recognize the information.

The visual information output unit 530 may output not only the leakage current information informing that an earth leakage has occurred, but also the leakage current type information informing which type of earth leakage has occurred.

The visual information output unit 530 may be provided in an arbitrary form capable of outputting visual information. As described above, the visual information output unit 530 may be determined according to the type of visual information calculated by the visual information calculating unit 520.

Figure 6:
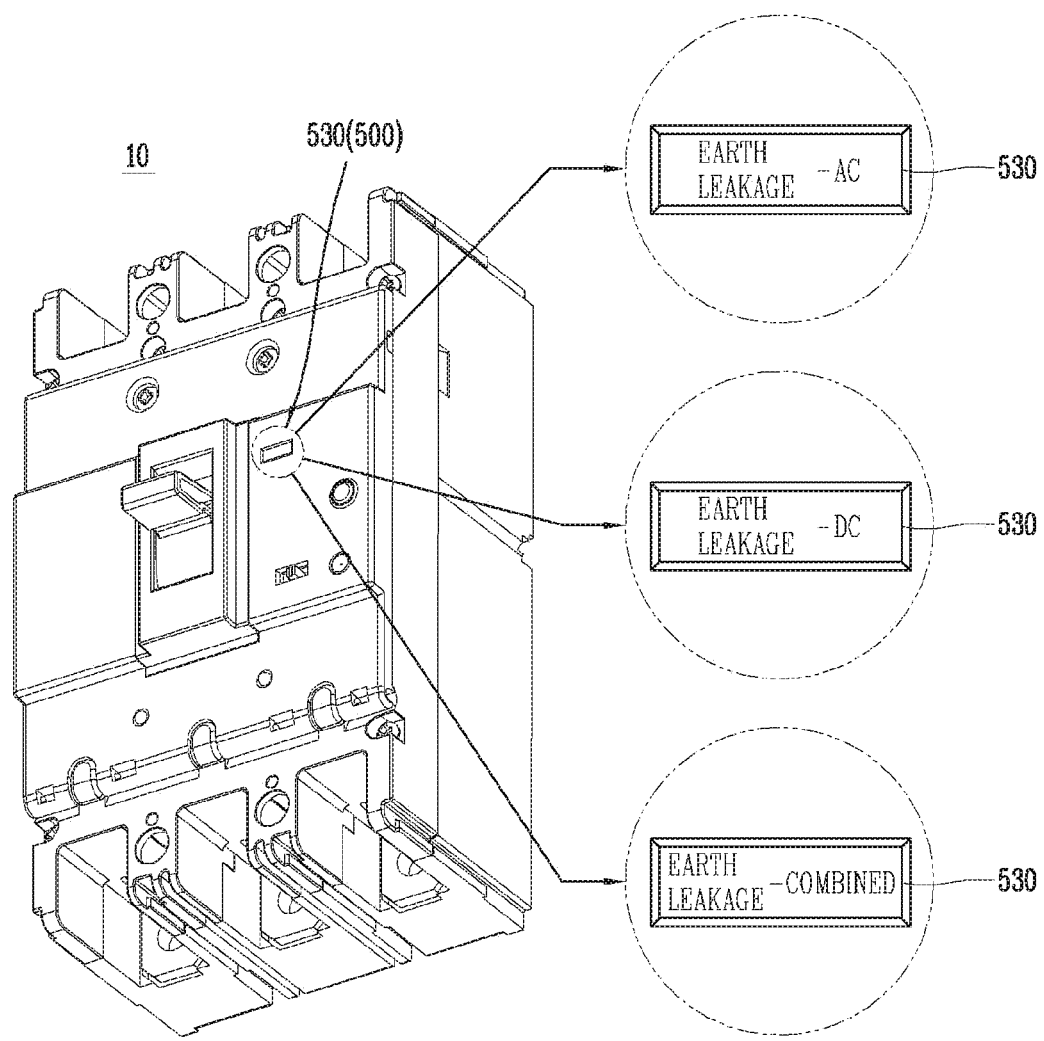
FIG. 6 is a diagram illustrating an exemplary operation of an earth leakage circuit breaker in accordance with an embodiment of the present disclosure.
Figure 7:
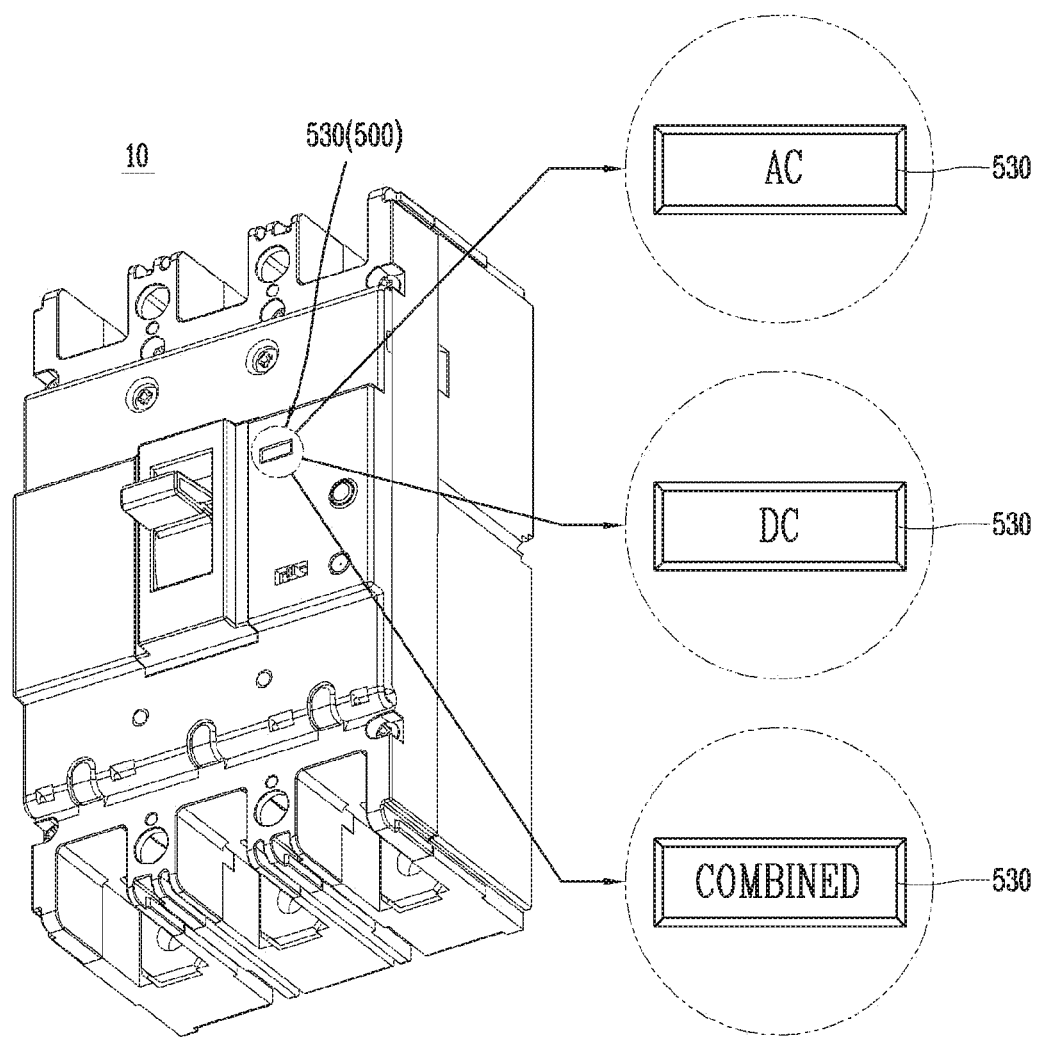
FIG. 7 is a diagram illustrating another exemplary operation of the earth leakage circuit breaker of FIG. 6.
Figure 8:
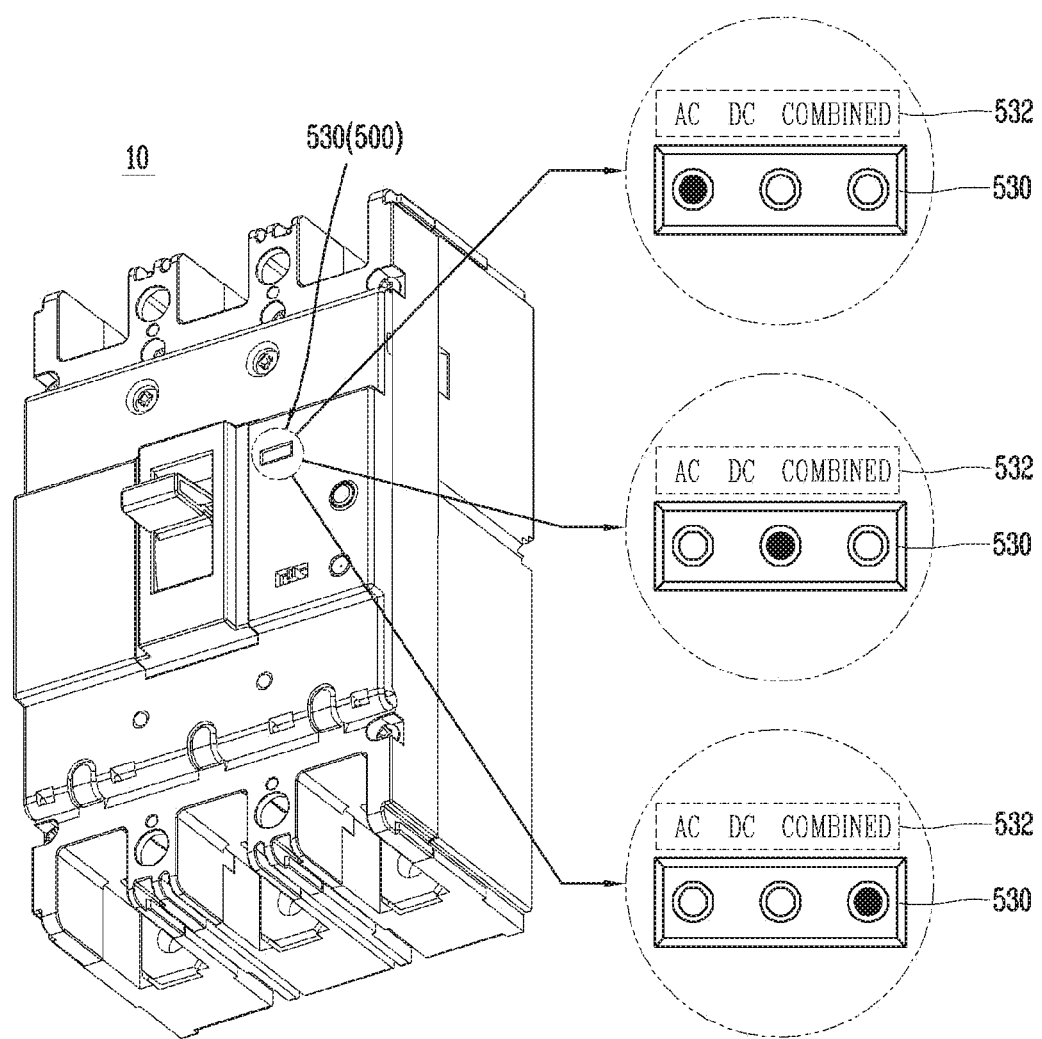
FIG. 8 is a diagram illustrating still another exemplary operation of the earth leakage circuit breaker of FIG. 6.

Referring to FIGS. 6 to 8, the visual information output unit 530 is configured to output various types of visual information.

In the embodiment illustrated in FIG. 6, the visual information output unit 530 is configured as an LCD, an OLED, an electronic ink panel, etc. having a screen capable of displaying characters or letters. Therefore, the visual information calculated by the visual information calculating unit 520 may be calculated in the form of text information.

In the embodiment illustrated in FIG. 7, the visual information output unit 530 includes a plurality of lamps. In one embodiment, the visual information output unit 530 may be provided with a plurality of small LED lamps.

Text (characters, letters) may be rendered by turning on some of the plurality of lamps of the visual information output unit 530 and turning off some others. Therefore, the visual information calculated by the visual information calculating unit 520 may be calculated in the form of information for determining lamps to be turned on and lamps to be turned off.

In the embodiment illustrated in FIG. 8, the visual information output unit 530 includes a plurality of lamps. The leakage current type information can be visually expressed by turning on one of the plurality of lamps of the visual information output unit 530 and turning of the others.

Therefore, the visual information calculated by the visual information calculating unit 520 may be calculated in the form of information for determining a lamp to be turned on.

In this case, since the lamp itself does not have a separate indicator, it may be difficult for the user to recognize the leakage current type information. Therefore, in the embodiment of the present disclosure, an index portion 532 for displaying the leakage current type information indicated by the lamp which is turned on may be separately provided.

In the illustrated embodiment, the index portion 532 is located above the plurality of lamps, but the position thereof is changeable.

Alternatively, the index portion 532 may be formed directly on the plurality of lamps. That is, any one of an AC current, a DC current, and a combined current is assigned to each lamp, and the index portion 532 is formed on the corresponding lamp.

The auditory information calculating unit 540 calculates the received leakage current type information as auditory information.

The auditory information calculated by the auditory information calculating unit 540 is transferred to the auditory information output unit 550. As described above, the auditory information calculating unit 540 and the auditory information output unit 550 are electrically connected to each other.

The auditory information output unit 550 outputs the auditory information calculated by the auditory information calculating unit 540 so that the user can auditorily recognize the information.

The auditory information output unit 550 may be provided in any form capable of outputting the auditory information.

Figure 9:
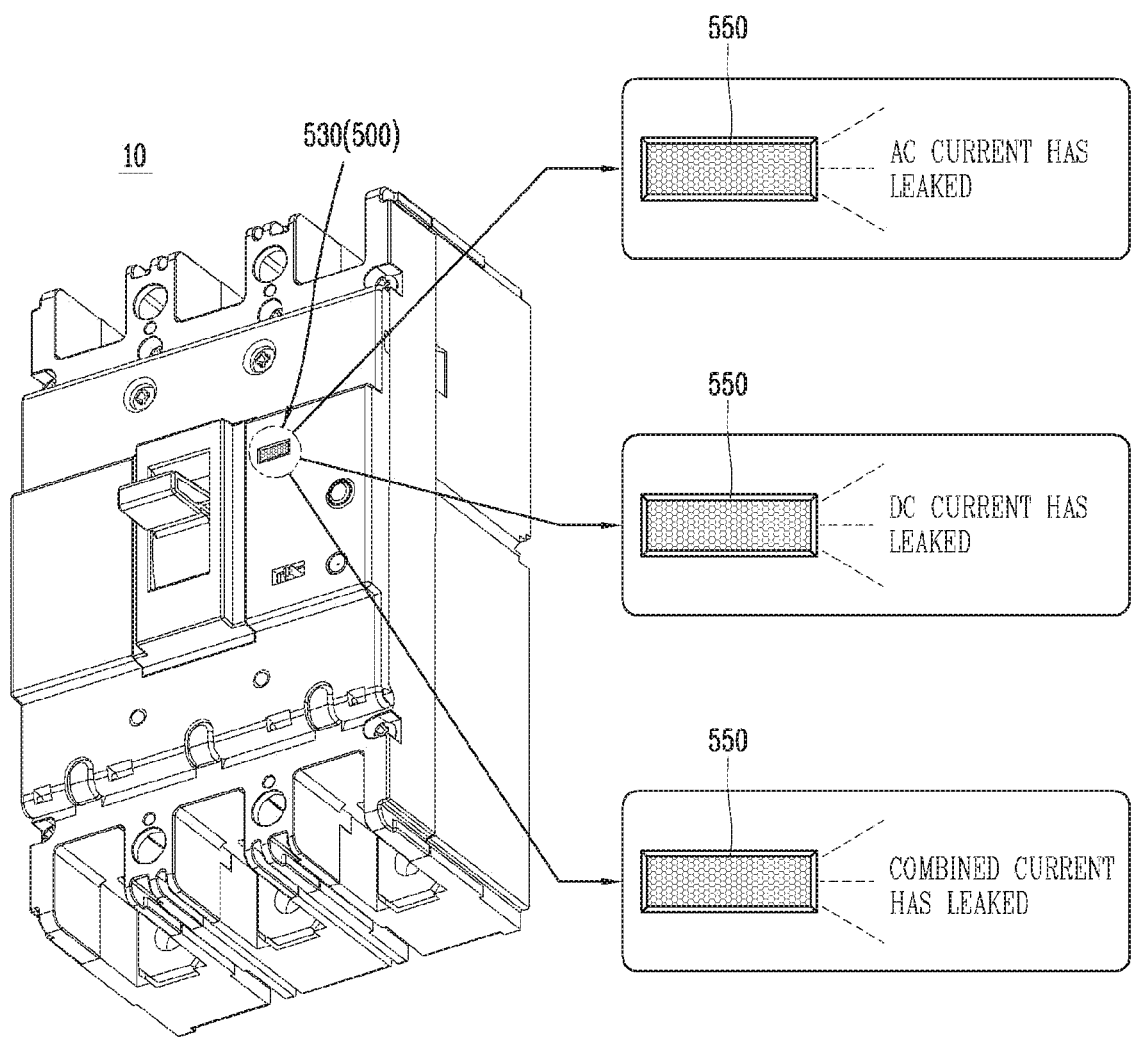
FIG. 9 is a perspective view illustrating an exemplary operation of an earth leakage circuit breaker in accordance with another embodiment of the present disclosure.

Referring to FIG. 9, the auditory information output unit 550 is configured as a speaker and outputs the leakage current information and the leakage current type information in the form of auditory information. In the embodiment of the present disclosure, even when the earth leakage circuit breaker 10 is not located near the user, the user can recognize whether the leakage current has been generated and type information of the generated leakage current through the auditory information.

In an embodiment not shown, the auditory information output unit 550 may be configured to output auditory information by varying the number of times that sounds are output, output intervals of the sounds, or pitches of the sounds. That is, the auditory information is output once when the leakage current type information corresponds to an AC current, twice when the leakage current type information corresponds to a DC current, and three times when the leakage current type information corresponds to a combined current.

The communication unit 560 transmits the received leakage current type information to the external device E.D so that a user who uses the external device E.D can recognize it.

The leakage current type information transmitted from the communication unit 560 may be visual information, auditory information, or the like. In addition, the leakage current type information may be in the form of tactile information, that is, in the form to be distinguished through different vibrations.

Figure 10:
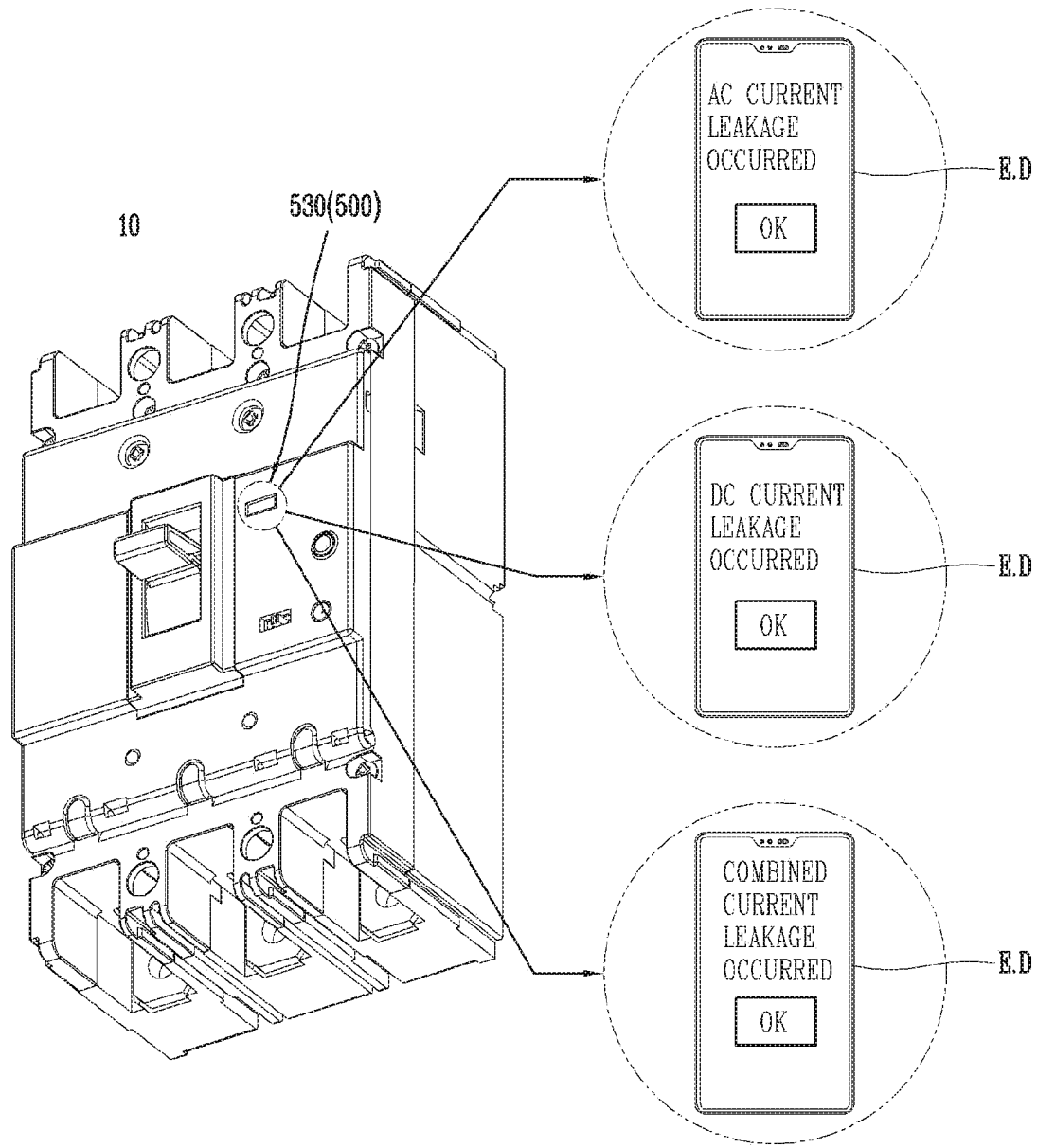
FIG. 10 is a perspective view illustrating an exemplary operation of an earth leakage circuit breaker in accordance with still another embodiment of the present disclosure.

Referring to FIG. 10, the communication unit 560 transfers the leakage current type information to an external device E.D used by the user. In the illustrated embodiment, the external device E.D is configured in the form of a mobile terminal such as a smart phone, and is connected to the communication unit 560 through wireless communication.

The external device E.D may be configured in any form capable of outputting information, for example, in the form of a monitor, a speaker or the like that may be installed at a specific location for use.

The external device E.D and the communication unit 560 may be connected by a wired communication method using a LAN cable or a conductor.

In addition, as described above, the leakage current type information transferred to the external device E.D may be in an arbitrary form capable of being recognized by the user, for example, in the form of visual information, auditory information or tactile information.

The communication unit 560 may be electrically connected to the visual information calculating unit 520 and the auditory information calculating unit 540, so as to receive the leakage current type information calculated in the form of the visual information and the auditory information.

Alternatively, the communication unit 560 may include a visual information calculating unit (not shown), an auditory information calculating unit (not shown), a tactile information calculating unit (not shown), and the like to calculate different types of information.

In addition, in the embodiment in which the power supply module 300 includes a power information calculating unit (not shown) and a power information transmitting unit (not shown) as described above, the output module 500 may receive power information from the power supply module 300.

The power information received by the output module 500 may be output to be recognized by the user through the same process as the process of calculating and outputting the leakage current type information.

In another embodiment not shown, a power information output module (not shown) displaying power information may be separately provided. That is, the output module 500 may output the leakage current type information, and the power information output module (not shown) may be configured to output the power information.

Figure 11:
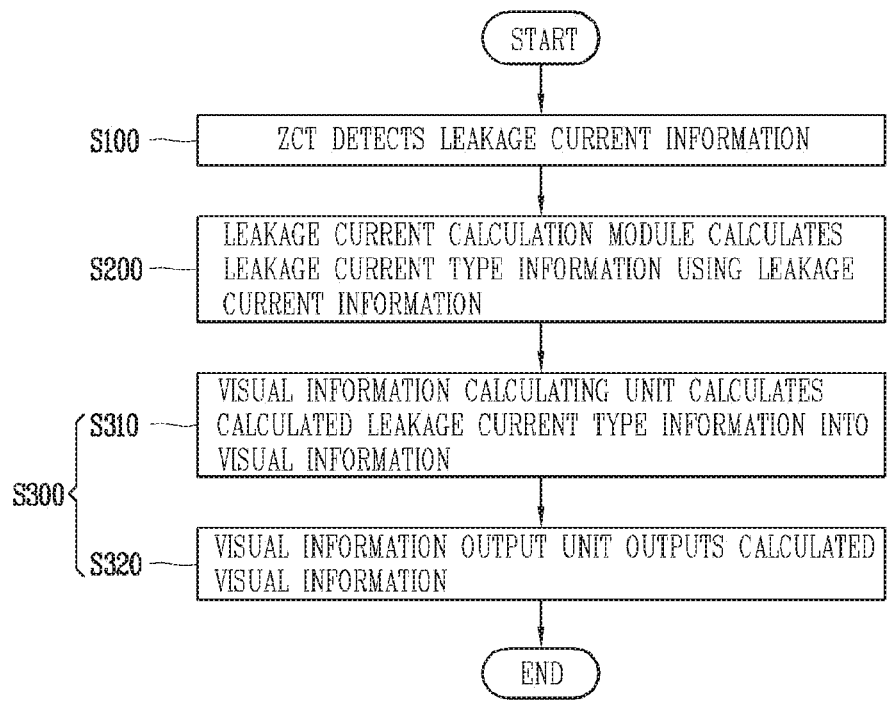
FIG. 11 is a flowchart illustrating a method of controlling an earth leakage circuit breaker according to FIGS. 6 to 8.
Figure 12:
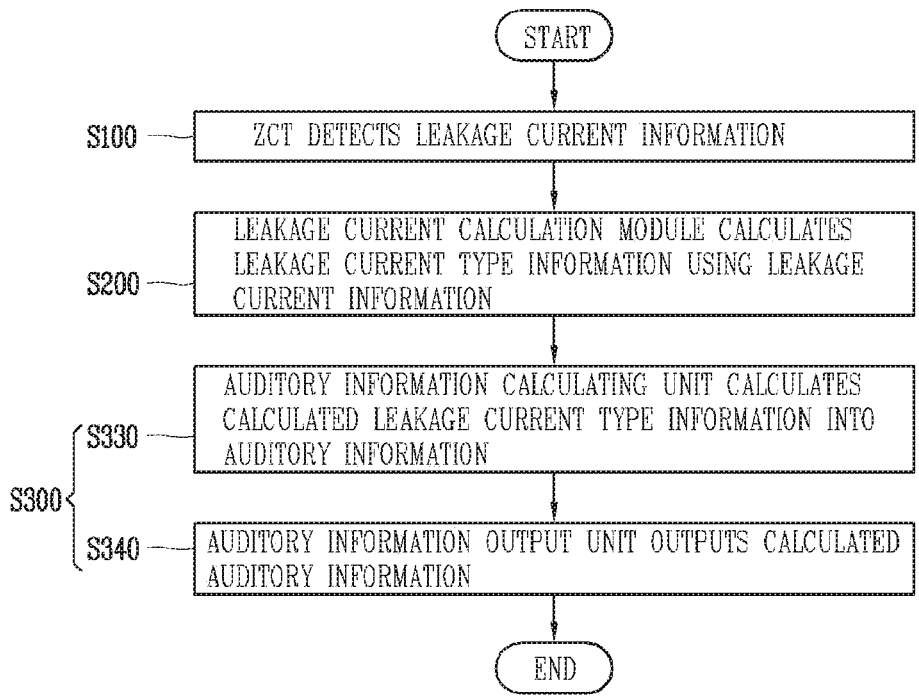
FIG. 12 is a flowchart illustrating a method of controlling an earth leakage circuit breaker according to FIG. 9.

3. Description of Method of Controlling Earth Leakage Circuit Breaker 10 According to Embodiments of the Disclosure Hereinafter, a detailed description will be given of a method of controlling an earth leakage circuit breaker 10 according to exemplary embodiments of the present disclosure, with reference to FIGS. 11 to 13.

The method of controlling the earth leakage circuit breaker 10 to be described below may be implemented through each component of the earth leakage breaker 10 described above.

(1) Description of Step (S100) of the ZCT 200 Detecting Leakage Current Information The ZCT 200 detects leakage current information regarding whether a current input through the three-phase load 100 has leaked (S100).

In detail, the primary current converting unit 210 converts a current input through the three-phase load 100 into a primary current.

The leakage current information detecting unit 220 detects leakage current information by calculating whether there is a zero current from the converted primary current.

When the leakage current information is detected, the leakage current information transmitting unit 230 transmits the leakage current information to the power supply module 300.

The leakage current information transmitting and receiving unit 330 of the power supply module 300 transmits the leakage current information received from the leakage current information transmitting unit 230 to the leakage current calculation module 400.

(2) Description of Step (S200) of the Leakage Current Calculation Module 400 Calculating Leakage Current Type Information Using the Leakage Current Information The leakage current calculation module 400 calculates leakage current type information using the leakage current information received from the power supply module 300 (S200).

Specifically, the leakage current information receiving unit 410 receives the leakage current information from the leakage current information transmitting and receiving unit 330 of the power supply module 300.

The type information calculating unit 420 calculates the leakage current type information by using the leakage current information received from the leakage current information receiving unit 410.

The leakage current type information calculated by the type information calculating unit 420 is transferred to the output module 500 through the type information output unit 430.

(3) Description of Step (S300) of the Output Module 500 Outputting the Calculated Leakage Current Type Information The output module 500 receives the leakage current type information from the type information output unit 430 of the leakage current calculation module 400, and calculates and outputs it in the form of information that can be recognized by the user (S300).

As described above, the output module 500 according to the embodiment of the present disclosure may calculate the leakage current type information into visual information, auditory information, or the like. In addition, information transmitted to the external device E.D through the communication unit 560 may be calculated into visual information, auditory information, tactile information, or the like.

The leakage current type information received by the type information receiving unit 510 of the output module 500 is transmitted to the visual information calculating unit 520, the auditory information calculating unit 540, and the communication unit 560, respectively.

1) Description of Step (S310) of the Visual Information Calculating Unit 520 Calculating the Calculated Leakage Current Type Information into Visual Information The visual information calculating unit 520 calculates the leakage current type information received from the type information receiving unit 510 into the form of visual information (S310).

As described above, the visual information calculated by the visual information calculating unit 520 may be determined according to the form of the visual information output unit 530.

The visual information calculated by the visual information calculating unit 520 is transferred to the visual information output unit 530.

2) Description of Step (S320) of the Visual Information Output Unit 530 Outputting the Calculated Visual Information The visual information output unit 530 outputs the leakage current type information calculated in the form of the visual information by the visual information calculating unit 520 (S320).

As described above, the visual information output unit 530 may be configured in any form by which the user can recognize the visual information.

The user may visually recognize the leakage current information and the leakage current type information of the earth leakage circuit breaker 10 through the visual information output from the visual information output unit 530.

In another embodiment not shown, the visual information calculating unit 520 and the visual information output unit 530 may calculate power information in the form of visual information and output the visual information. In this embodiment, the user can visually recognize even the power information of the earth leakage circuit breaker 10.

3) Description of Step (S330) of the Auditory Information Calculating Unit 540 Calculating the Calculated Leakage Current Information in the Form of Auditory Information The auditory information calculating unit 540 calculates the leakage current type information received from the type information receiving unit 510 into the form of auditory information (S330).

As described above, the auditory information calculating unit 540 may calculate the leakage current type information in the form of arbitrary auditory information that can be auditorily recognized by the user.

The auditory information calculated by the auditory information calculating unit 540 is transferred to the auditory information output unit 550.

4) Description of Step (S340) of the Auditory Information Output Unit 550 Outputting the Calculated Auditory Information The auditory information output unit 550 outputs the leakage current type information calculated in the form auditory information by the auditory information calculating unit 550 (S340).

As described above, the auditory information output unit 550 may be configured in any form by which the user can recognize the auditory information. In one embodiment, the auditory information output unit 550 may be configured as a speaker or an element capable of generating sounds by hitting.

The user may auditorily recognize the leakage current information and the leakage current type information of the earth leakage circuit breaker 10 through the auditory information output from the auditory information output unit 550.

In another embodiment not shown, the auditory information calculating unit 540 and the auditory information output unit 550 may calculate power information in the form of auditory information and output the auditory information. In this embodiment, the user can auditorily recognize even the power information of the earth leakage circuit breaker 10.

5) Description of Step (S350) of the Communication Unit 560 Transmitting the Calculated Leakage Current Type Information to External Device E.D The communication unit 560 transmits the leakage current type information received from the type information receiving unit 510 to the external device E.D (S350).

The leakage current type information transmitted by the communication unit 560 may be at least one of visual information, auditory information, and tactile information.

To this end, the communication unit 560 may be electrically connected to the visual information calculating unit 520 and the auditory information calculating unit 540 so as to receive the calculated visual information and auditory information.

Alternatively, as aforementioned, the communication unit 560 may include a visual information calculating unit (not shown), an auditory information calculating unit (not shown), a tactile information calculating unit (not shown), and the like to calculate different types of information.

The communication unit 560 is connected to the external device E.D to perform communication with the external device E.D. The communication unit 560 may be connected to the external device E.D in a wired or wireless communication manner.

The leakage current information and the leakage current type information are transmitted to the external device E.D in the form of visual information, auditory information, or tactile information. Therefore, even when the earth leakage circuit breaker 10 is not located near the user, the user can easily recognize whether a leakage current has been generated and the type of the generated leakage current.

In another embodiment not shown, the communication unit 560 may transmit power information to the external device E.D. In this embodiment, the user can auditorily recognize even the power information of the earth leakage circuit breaker 10.

4. Description of Effects of Earth Leakage Circuit Breaker 10 According to Embodiment of the Disclosure The earth leakage circuit breaker 10 according to the embodiment of the present disclosure includes the type information calculating unit 420 for calculating the type information related to the leakage current detected by the ZCT 200. The leakage current type information calculated by the type information calculating unit 420 is output together with the leakage current information through the output module 500.

Therefore, when a leakage current is generated, the user can immediately recognize both leakage current information and leakage current type information.

In addition, the output module 500 includes the visual information calculating unit 520 and the visual information output unit 530. The leakage current type information is calculated in the form of the visual information by the visual information calculating unit 520 and is output through the visual information output unit 530.

Thus, the user can easily recognize both the leakage current information and the leakage current type information in the visual manner.

In addition, the output module 500 includes the auditory information calculating unit 540 and the auditory information output unit 550. The leakage current type information is calculated in the form of the auditory information by the auditory information calculating unit 540 and is output through the auditory information output unit 550.

Thus, the user can easily recognize both the leakage current information and the leakage current type information in the auditory manner.

In addition, the output module 500 includes the communication unit 560 configured to communicate with the external device E.D. The communication unit 560 may transmit the leakage current type information to the external device E.D in the form of visual information, auditory information, or tactile information.

Therefore, even when the earth leakage circuit breaker 10 is not located near the user, the user can easily recognize both the leakage current information and the leakage current type information in the visual manner through the external device E.D.

Furthermore, the output module 500 may be configured to output the power information. Thus, the user can easily recognize even the power information as well as the leakage current information and the leakage current type information.

All of the disclosed methods and procedures described in this disclosure can be implemented, at least in part, using one or more computer programs or components. These components may be provided as a series of computer instructions on any conventional computer readable medium or machine readable medium, including volatile and nonvolatile memory, such as RAM, ROM, flash memory, magnetic or optical disks, optical memory, or other storage media. The instructions may be provided as software or firmware, and may be implemented in whole or in part in hardware components such as ASICs, FPGAs, DSPs, or any other similar devices. The instructions may be configured to be executed by one or more processors or other hardware components which, when executing the series of computer instructions, perform or facilitate the performance of all or part of the disclosed methods and procedures.

Although it has been described above with reference to preferred embodiments of the present disclosure, it will be understood that those skilled in the art are able to variously modify and change the present disclosure without departing from the spirit and scope of the invention described in the claims below.

What is claimed is:

1. An earth leakage circuit breaker, comprising:
a zero current transformer (ZCT) to detect leakage current information related to a leakage current;
a leakage current controller electrically connected to the zero current transformer, the leakage current controller to calculate leakage current type information using the leakage current information detected by the zero current transformer; and
an output device electrically connected to the leakage current controller, the output device to output the leakage current type information calculated by the leakage current controller,
wherein the leakage current controller includes a type information calculating unit that calculates type information related to the leakage current by using the received leakage current information,
wherein the received leakage current information includes AC current information, DC current information, and combined current information,
wherein the output device comprises an auditory information calculating unit to calculate three types of the leakage current type information in a form of different auditory information for each of the three types, and
wherein the output device comprises an auditory information output unit to output the calculated different auditory information corresponding to the three types of the leakage current type information.

2. The earth leakage circuit breaker of claim 1, wherein the output device comprises a visual information calculating unit to calculate the calculated leakage current type information in a form of visual information.

3. The earth leakage circuit breaker of claim 2, wherein the output device comprises a visual information output unit to output the calculated visual information.

4. The earth leakage circuit breaker of claim 1, wherein the output device comprises a communication unit to transmit the calculated leakage current type information to outside.

5. A method for controlling an earth leakage circuit breaker, the method comprising:
(a) detecting, by a zero current transformer, leakage current information;
(b) calculating, by a leakage current calculation module, leakage current type information using the leakage current information; and
(c) outputting, by an output module, the calculated leakage current type information,
(d1) calculating, by an auditory information calculating unit, the calculated leakage current type information in a form of auditory information; and
(d2) outputting, by an auditory information output unit, the calculated auditory information,
wherein the leakage current type information calculated by the auditory information calculating unit includes AC current information, DC current information, and combined current information,
wherein the auditory information output unit is configured to output the auditory information in a form of different auditory information for each of three types of the leakage current type information.

6. The method of claim 5, further comprising:
(c1) calculating, by a visual information calculating unit, the calculated leakage current type information in a form of visual information; and
(c2) outputting, by a visual information output unit, the calculated visual information.

7. The method of claim 5, further comprising:
(e) transmitting, by a communication unit, the leakage current type information to an external device.

* * * * *